(12) United States Patent
Kabasawa

(10) Patent No.: US 12,467,442 B2
(45) Date of Patent: Nov. 11, 2025

(54) CLEANING APPARATUS FOR VACUUM EXHAUST SYSTEM

(71) Applicant: Edwards Japan Limited, Yachiyo (JP)

(72) Inventor: Takashi Kabasawa, Yachiyo (JP)

(73) Assignee: Edwards Japan Limited, Yachiyo (JP)

( * ) Notice: Subject to any disclaimer, the term of this patent is extended or adjusted under 35 U.S.C. 154(b) by 406 days.

(21) Appl. No.: 18/004,248

(22) PCT Filed: Jul. 30, 2021

(86) PCT No.: PCT/JP2021/028254
§ 371 (c)(1),
(2) Date: Jan. 4, 2023

(87) PCT Pub. No.: WO2022/030373
PCT Pub. Date: Feb. 10, 2022

(65) Prior Publication Data
US 2023/0264235 A1    Aug. 24, 2023

(30) Foreign Application Priority Data
Aug. 3, 2020   (JP) ................................. 2020-131523

(51) Int. Cl.
*B08B 7/00*   (2006.01)
*B08B 1/16*   (2024.01)
(Continued)

(52) U.S. Cl.
CPC .............. *F04B 37/16* (2013.01); *B08B 1/165* (2024.01); *B08B 1/36* (2024.01); *B08B 7/0071* (2013.01);
(Continued)

(58) Field of Classification Search
CPC ....... F04D 19/04; F04D 19/042; B08B 1/165; B08B 1/32
See application file for complete search history.

(56) References Cited

U.S. PATENT DOCUMENTS

2010/0209259 A1   8/2010   Kawamura et al.
2011/0252969 A1   10/2011  Fischer et al.
(Continued)

FOREIGN PATENT DOCUMENTS

CN    118564763 A  *  8/2024  ............. B08B 9/027
JP    H0539576 A       2/1993
(Continued)

OTHER PUBLICATIONS

International Search Report and Written Opinion of International Application No. PCT/JP2021/028254 dated Sep. 28, 2021, 13 Pages.
(Continued)

*Primary Examiner* — Nathaniel E Wiehe
*Assistant Examiner* — Jackson N Gillenwaters
(74) *Attorney, Agent, or Firm* — Shumaker & Sieffert, P.A.

(57) ABSTRACT

A cleaning apparatus for a vacuum exhaust system capable of preventing redeposition of deposits on a downstream side of a vacuum pump is provided. A cold trap capable of causing deposits to be formed by cooling gas containing a sublimation component, at least one first vacuum pump disposed upstream of the cold trap, at least one first piping connecting the first vacuum pump to the cold trap, at least one second vacuum pump disposed downstream of the cold trap, and at least one second piping connecting the second vacuum pump to the cold trap are provided. At least a part of the first vacuum pump or the first piping is configured to be heated to higher than or equal to a sublimation temperature of the sublimation component. The cold trap is configured to be cooled to less than or equal to the sublimation temperature of the sublimation component.

5 Claims, 11 Drawing Sheets

(51) Int. Cl.
*B08B 1/36* (2024.01)
*B08B 7/04* (2006.01)
*B08B 9/027* (2006.01)
*F04B 37/16* (2006.01)
*F04D 19/04* (2006.01)
*H01L 21/67* (2006.01)

(52) U.S. Cl.
CPC .............. *B08B 7/0092* (2013.01); *B08B 7/04* (2013.01); *B08B 9/027* (2013.01); *F04D 19/042* (2013.01); *B08B 2209/027* (2013.01); *H01L 21/67017* (2013.01)

(56) References Cited

U.S. PATENT DOCUMENTS

| | | |
|---|---|---|
| 2019/0120236 A1 | 4/2019 | Kabasawa et al. |
| 2022/0082103 A1 | 3/2022 | Kabasawa |

FOREIGN PATENT DOCUMENTS

| | | | | |
|---|---|---|---|---|
| JP | H10317147 | A | | 12/1998 |
| JP | 3080710 | B2 * | | 8/2000 |
| JP | 2000223484 | A * | | 8/2000 |
| JP | 2005120955 | A | | 5/2005 |
| JP | 2006218374 | A | | 8/2006 |
| JP | 2007113455 | A * | 5/2007 | ............. F04D 19/04 |
| JP | 2017025793 | A | | 2/2017 |
| WO | WO-2020145150 | A1 * | 7/2020 | ............. F04D 19/04 |

OTHER PUBLICATIONS

Extended Search Report from counterpart European Application No. 21853361.0 dated Jul. 10, 2024, 9 pp.

* cited by examiner

CLEANING APPARATUS FOR VACUUM EXHAUST SYSTEM

This application is a U.S. national phase application under 35 U.S.C. § 371 of international application number PCT/JP2021/028254 filed on Jul. 30, 2021, which claims the benefit of JP application number 2020-131523 filed on Aug. 3, 2020. The entire contents of each of international application number PCT/JP2021/028254 and JP application number 2020-131523 are incorporated herein by reference.

TECHNICAL FIELD

The present disclosure relates to a cleaning apparatus for a vacuum exhaust system that uses a turbomolecular pump or the like.

BACKGROUND

A turbomolecular pump is commonly known as one type of vacuum pump. In a turbomolecular pump, a motor in a pump main body is energized to rotate rotor blades, which hit gaseous molecules of gas (process gas) drawn into the pump main body, thereby exhausting the gas. Some types of such a turbomolecular pump have heaters and cooling pipes to appropriately manage temperatures inside the pumps.

[Patent Document] Patent Document 1: Japanese Patent Application Publication No. 2011-80407

SUMMARY

In a vacuum pump such as the turbomolecular pump described above, substances in the gas, which are being transferred, may be deposited. For example, the gas used in an etching process of a semiconductor manufacturing apparatus compresses the gas (process gas) drawn into the pump main body and gradually increases the pressure. In this process, if the temperature of an exhaust flow passage decreases below a sublimation temperature, the gas may cause side reaction products to be deposited in the vacuum pump and piping, blocking the exhaust flow passage. Also, in a process of compressing the gas drawn from the pump inlet port in the pump, pressure of the drawn gas may exceed pressure at which a phase changes from gas to solid, causing the gas to change into a solid in the pump. As a result, solids of side reaction products may accumulate in the pump, and these deposits may cause problems. Also, to remove the deposits of side reaction products, the vacuum pump and piping benefit if cleaned. Moreover, in some cases, the vacuum pump and piping may be repaired or replaced with new ones. Overhaul for such work may temporarily stop the semiconductor manufacturing apparatus. Furthermore, a period of overhaul may prolong to several weeks in some cases.

Some conventional vacuum pumps have a function of increasing a temperature of an internal exhaust path using a heater during normal exhaust operation to prevent side reaction products from adhering to the interior (Patent Document 1). Patent Document 1 discloses an apparatus that heats the downstream side of an exhaust flow passage of a pump to increase sublimation pressure of drawn gas and thus allows the downstream side to be a gas phase area. This prevents side reaction products from accumulating in the pump and blocking the exhaust flow passage. Such heating may expand or deform components of the vacuum pump and bring the same into contact with one another. To avoid this, a limit is set on a temperature increase (target temperature for heating) to manage the temperature so as not to rise above a preset value.

Furthermore, the present applicant has proposed a vacuum pump that has a function of heating a gas flow passage of the vacuum pump to gasify and remove deposits in a standby state while the vacuum pump is not used for a process such as semiconductor manufacturing (also referred to as "cleaning function" or "cleaning mode") (Japanese Patent Application No. 2019-165839). Such a vacuum pump can remove the deposits during standby time of the vacuum pump, so that the gas flow passage does not have to be continuously maintained at a high temperature during processing. This allows a permissible flow rate of the vacuum pump to be increased.

Considering further improvements of this type of vacuum pump and an exhaust system incorporating the vacuum pump, there may be a possibility that gas heated for cleaning is cooled while flowing through the vacuum pump and devices such as piping located on a downstream side (in a subsequent stage), causing deposits to be redeposited in downstream devices.

It is an object of the present disclosure to provide a cleaning apparatus for a vacuum exhaust system capable of preventing redeposition of deposits on a downstream side of a vacuum pump.

(1) To achieve the above object, the present disclosure is directed to a cleaning apparatus for a vacuum exhaust system that exhausts gas, the cleaning apparatus including:
a cold trap capable of causing deposits to be formed by cooling gas containing a sublimation component;
at least one first vacuum pump disposed upstream of the cold trap;
at least one first exhaust path connecting the first vacuum pump to the cold trap;
at least one second vacuum pump disposed downstream of the cold trap; and
at least one second exhaust path connecting the second vacuum pump to the cold trap, wherein
at least a part of the first vacuum pump or the first exhaust path is configured to be heated to higher than or equal to a sublimation temperature of the sublimation component, and
the cold trap is configured to be cooled to less than or equal to the sublimation temperature of the sublimation component.

(2) In order to achieve the above object, another aspect of the present disclosure is directed to the cleaning apparatus for a vacuum exhaust system according to (1), further including: at least one switching valve disposed in the first exhaust path; and
at least one third exhaust path connecting the switching valve to the second exhaust path.

(3) In order to achieve the above object, another aspect of the present disclosure is directed to the cleaning apparatus for a vacuum exhaust system according to (1) or (2), wherein the cold trap includes:
a casing having an inlet port and an outlet port;
at least one plate-shaped portion disposed in the casing; and
a cooling mechanism configured to cool the plate-shaped portion.

(4) In order to achieve the above object, another aspect of the present disclosure is directed to the cleaning apparatus for a vacuum exhaust system according to (3), wherein
the cold trap is configured such that, with the plate-shaped portion, which has at least one opening, being provided in plurality, the plurality of plate-shaped portions are layered with the openings positioned in different phases.

(5) In order to achieve the above object, another aspect of the present disclosure is directed to the cleaning apparatus for a vacuum exhaust system according to (3) or (4), wherein the cold trap includes:

a rotating shaft disposed in the casing; and at least one scraping portion fixed to the rotating shaft, and the scraping portion is configured to be rotatable along a plate surface of the plate-shaped portion.

(6) In order to achieve the above object, another aspect of the present disclosure is directed to the cleaning apparatus for a vacuum exhaust system according to any of (1) to (5), further including: a branch path disposed in the second exhaust path;

an on-off valve disposed in the branch path; and a deposit collection container disposed downstream of the on-off valve.

(7) In order to achieve the above object, another aspect of the present disclosure is directed to the cleaning apparatus for a vacuum exhaust system according to any of (3) to (5), further including: a deposit discharge port disposed in the casing of the cold trap;

an on-off valve disposed downstream of the deposit discharge port; and a deposit collection container disposed downstream of the on-off valve.

According to the above disclosure, a cleaning apparatus for a vacuum exhaust system capable of preventing redeposition of deposits on the downstream side of a vacuum pump is provided.

DETAILED DESCRIPTION

Figure 1:
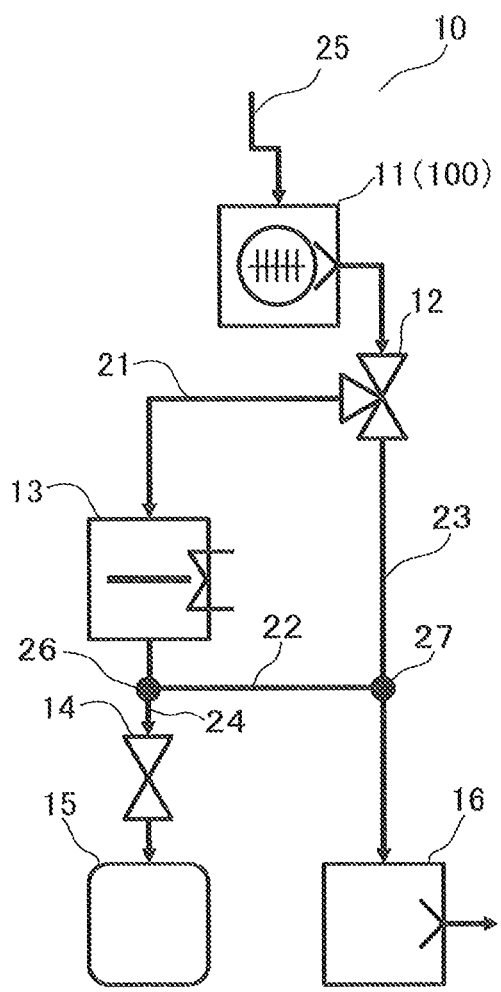
FIG. 1 is a block diagram schematically showing a cleaning apparatus for a vacuum exhaust system according to a first example of the present disclosure.

Referring to the drawings, a cleaning apparatus for a vacuum exhaust system according to examples of the present disclosure is now described. FIG. 1 schematically shows the configuration of a cleaning apparatus 10 according to a first example of the present disclosure in a block diagram. This cleaning apparatus 10 has main devices including a first vacuum pump 11, a switching valve 12, a cold trap 13, an on-off valve 14, a deposit collection container 15, and a second vacuum pump 16.

These devices 11 to 16 are connected via various types of piping. The first vacuum pump 11 is connected to the cold trap 13 via first piping 21 as a first exhaust path, and the switching valve 12 is arranged in the middle of the first piping 21. The cold trap 13 is connected to the second vacuum pump 16 via second piping 22 as a second exhaust path. These various types of piping are configured by combining a plurality of piping parts. Various general piping parts may be used as the piping parts, and thus the detailed description of the piping parts is omitted.

The switching valve 12 has a three-way valve structure, and the switching valve 12 is connected to the second piping 22 via third piping 23 as a third exhaust path. The second piping 22 is connected to the deposit collection container 15 via a branch pipe 24 as a branch path, and an on-off valve 14 is arranged in the middle of the branch pipe 24. Reference numeral 25 in FIG. 1 denotes fourth piping connected to the inlet side of the first vacuum pump 11.

Figure 2:
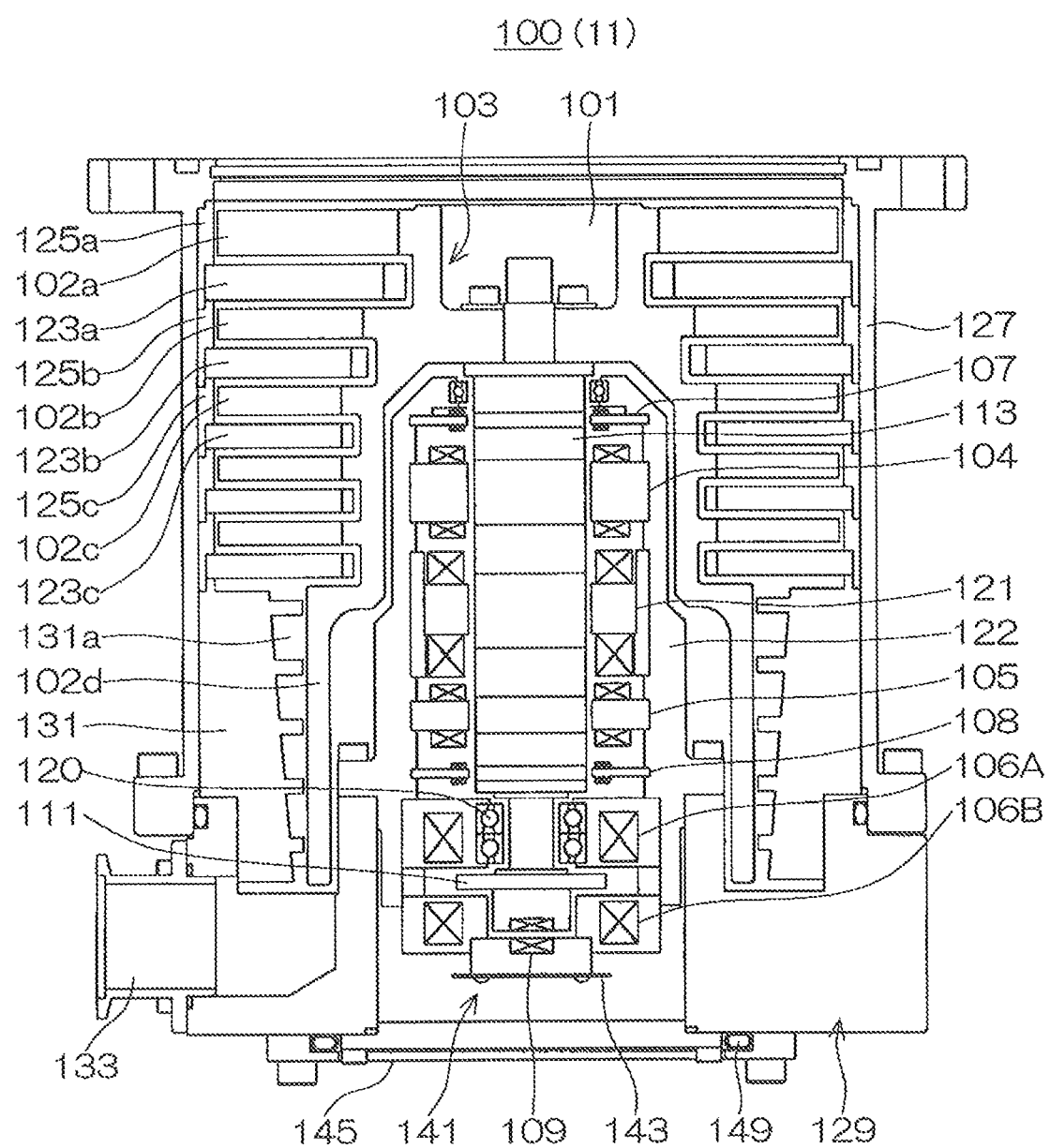
FIG. 2 is a vertical cross-sectional view of a first vacuum pump (turbomolecular pump) according to the first example of the present disclosure.
Figure 6:
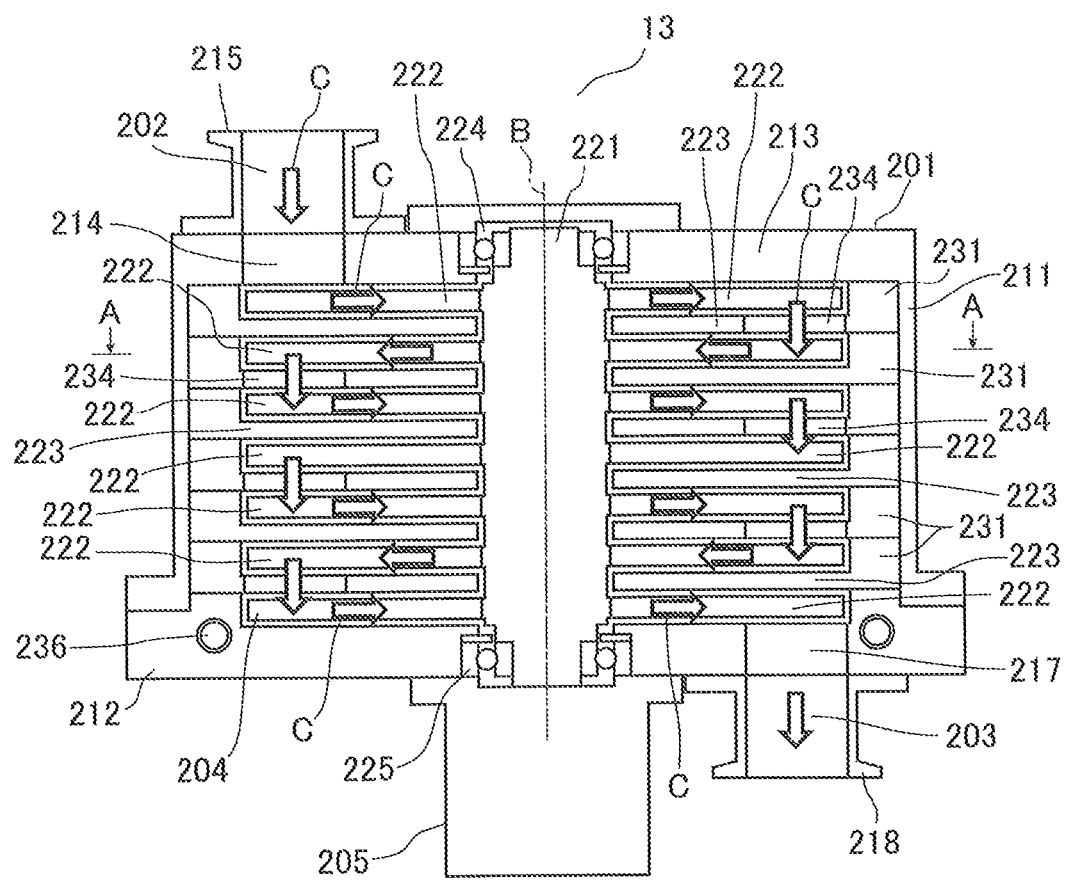
FIG. 6 is a vertical cross-sectional view showing a cold trap.
Figure 7:
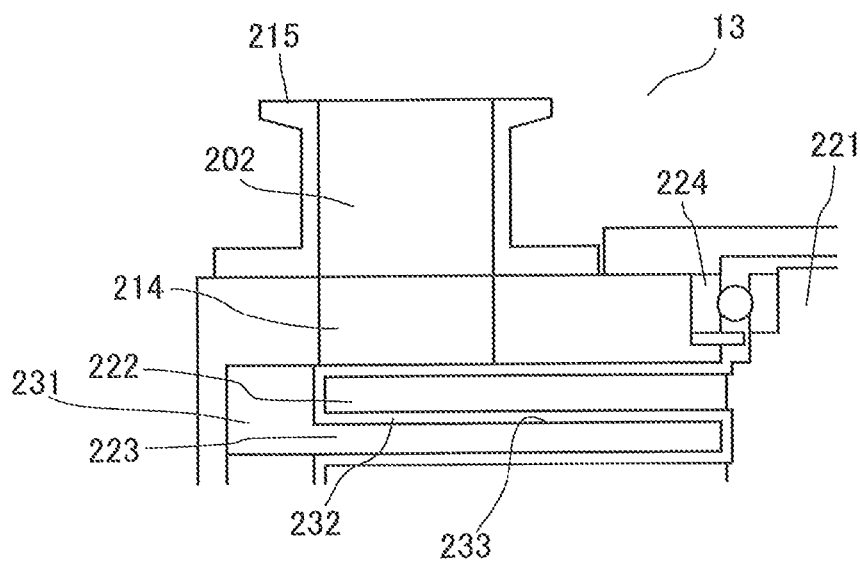
FIG. 7 is an enlarged vertical cross-sectional view showing a part of the cold trap.
Figure 8:
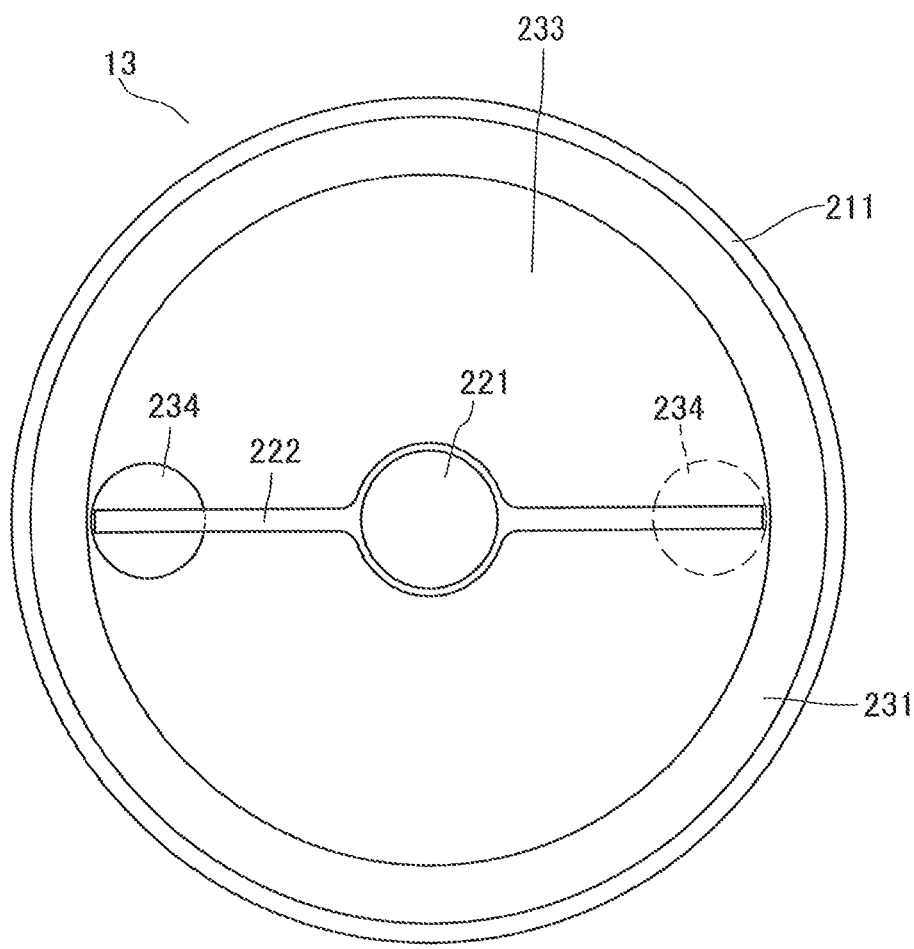
FIG. 8 is a cross-sectional plan view taken along line A-A in FIG. 6.

The first vacuum pump 11 may be a turbomolecular pump 100 shown in FIG. 2. The cold trap 13 may be of a stacked type as shown in FIGS. 6 to 8. The specific configurations of the turbomolecular pump 100 and the cold trap 13 are described below.

The deposit collection container 15 is capable of containing the deposits formed in the cold trap 13. The second vacuum pump 16 may be any general vacuum pump, but the present example uses a dry pump.

The turbomolecular pump 100 used as the first vacuum pump 11 is now described. FIG. 2 shows the turbomolecular pump 100. This turbomolecular pump 100 is to be connected via the fourth piping 25 shown in FIG. 1 to a vacuum chamber (not shown) of an exhaust target apparatus such as a semiconductor manufacturing apparatus.

FIG. 2 is a vertical cross-sectional view of the turbomolecular pump 100. As shown in FIG. 2, the turbomolecular pump 100 has a circular outer cylinder 127 having an inlet port 101 at its upper end. A rotating body 103 in the outer cylinder 127 includes a plurality of rotor blades 102 (102a, 102b, 102c, ... ), which are turbine blades for gas suction and exhaustion, in its outer circumference section. The rotor blades 102 extend radially in multiple stages. The rotating body 103 has a rotor shaft 113 in its center. The rotor shaft 113 is suspended in the air and position-controlled by a magnetic bearing of 5-axis control, for example.

Upper radial electromagnets 104 include four electromagnets arranged in pairs on an X-axis and a Y-axis. Four upper radial sensors 107 are provided in close proximity to the upper radial electromagnets 104 and associated with the respective upper radial electromagnets 104. Each upper radial sensor 107 may be an inductance sensor or an eddy current sensor having a conduction winding, for example, and detects the position of the rotor shaft 113 based on a change in the inductance of the conduction winding, which changes according to the position of the rotor shaft 113. The upper radial sensors 107 are configured to detect a radial displacement of the rotor shaft 113, that is, the rotating body 103 fixed to the rotor shaft 113, and send it to the controller (not illustrated).

In the controller, for example, a compensation circuit having a PID adjustment function generates an excitation control command signal for the upper radial electromagnets 104 based on a position signal detected by the upper radial sensors 107. Based on this excitation control command signal, an amplifier circuit 150 (described below) controls and excites the upper radial electromagnets 104 to adjust a radial position of an upper part of the rotor shaft 113.

The rotor shaft 113 may be made of a high magnetic permeability material (such as iron and stainless steel) and is configured to be attracted by magnetic forces of the upper radial electromagnets 104. The adjustment is performed independently in the X-axis direction and the Y-axis direction. Lower radial electromagnets 105 and lower radial sensors 108 are arranged in a similar manner as the upper radial electromagnets 104 and the upper radial sensors 107 to adjust the radial position of the lower part of the rotor shaft 113 in a similar manner as the radial position of the upper part.

Additionally, axial electromagnets 106A and 106B are arranged so as to vertically sandwich a metal disc 111, which has a shape of a circular disc and is provided in the lower part of the rotor shaft 113. The metal disc 111 is made of a high magnetic permeability material such as iron. An axial sensor 109 is provided to detect an axial displacement of the rotor shaft 113 and send an axial position signal to the controller.

In the controller, the compensation circuit having the PID adjustment function may generate an excitation control command signal for each of the axial electromagnets 106A and 106B based on the signal on the axial position detected by the axial sensor 109. Based on these excitation control command signals, the amplifier circuit 150 controls and excites the axial electromagnets 106A and 106B separately so that the axial electromagnet 106A magnetically attracts the metal disc 111 upward and the axial electromagnet 106B attracts the metal disc 111 downward. The axial position of the rotor shaft 113 is thus adjusted.

As described above, the controller appropriately adjusts the magnetic forces exerted by the axial electromagnets 106A and 106B on the metal disc 111, magnetically levitates the rotor shaft 113 in the axial direction, and suspends the rotor shaft 113 in the air in a non-contact manner. The amplifier circuit 150, which controls and excites the upper radial electromagnets 104, the lower radial electromagnets 105, and the axial electromagnets 106A and 106B, is described below.

The motor 121 includes a plurality of magnetic poles circumferentially arranged to surround the rotor shaft 113. Each magnetic pole is controlled by the controller so as to drive and rotate the rotor shaft 113 via an electromagnetic force acting between the magnetic pole and the rotor shaft 113. The motor 121 also includes a rotational speed sensor (not shown), such as a Hall element, a resolver, or an encoder, and the rotational speed of the rotor shaft 113 is detected based on a detection signal of the rotational speed sensor.

Furthermore, a phase sensor (not shown) is attached adjacent to the lower radial sensors 108 to detect the phase of rotation of the rotor shaft 113. The controller detects the position of the magnetic poles using both detection signals of the phase sensor and the rotational speed sensor.

A plurality of stator blades 123a, 123b, 123c, . . . are arranged slightly spaced apart from the rotor blades 102 (102a, 102b, 102c, . . . ). Each rotor blade 102 (102a, 102b, 102c, . . . ) is inclined by a predetermined angle from a plane perpendicular to the axis of the rotor shaft 113 in order to transfer exhaust gas molecules downward through collision.

The stator blades 123 are also inclined by a predetermined angle from a plane perpendicular to the axis of the rotor shaft 113. The stator blades 123 extend inward of the outer cylinder 127 and alternate with the stages of the rotor blades 102. The outer circumference ends of the stator blades 123 are inserted between and thus supported by a plurality of layered stator blade spacers 125 (125a, 125b, 125c, . . . ).

The stator blade spacers 125 are ring-shaped members made of a metal, such as aluminum, iron, stainless steel, or copper, or an alloy containing these metals as components, for example. The outer cylinder 127 is fixed to the outer circumferences of the stator blade spacers 125 with a slight gap. A base portion 129 is located at the base of the outer cylinder 127. The base portion 129 has an outlet port 133 providing communication to the outside. The exhaust gas transferred to the base portion 129 is then sent to the outlet port 133.

According to the application of the turbomolecular pump, a threaded spacer 131 may be provided between the lower part of the stator blade spacer 125 and the base portion 129. The threaded spacer 131 is a cylindrical member made of a metal such as aluminum, copper, stainless steel, or iron, or an alloy containing these metals as components. The threaded spacer 131 has a plurality of helical thread grooves 131a in its inner circumference surface. When exhaust gas molecules move in the rotation direction of the rotating body 103, these molecules are transferred toward the outlet port 133 in the direction of the helix of the thread grooves 131a. In the lowermost section of the rotating body 103 below the rotor blades 102 (102a, 102b, 102c, . . . ), a cylindrical portion 102d extends downward. The outer circumference surface of the cylindrical portion 102d is cylindrical and projects toward the inner circumference surface of the threaded spacer 131. The outer circumference surface is adjacent to but separated from the inner circumference surface of the threaded spacer 131 by a predetermined gap. The exhaust gas transferred to the thread grooves 131a by the rotor blades 102 and the stator blades 123 is guided by the thread grooves 131a to the base portion 129.

The base portion 129 is a disc-shaped member forming the base section of the turbomolecular pump 100, and is generally made of a metal such as iron, aluminum, or stainless steel. The base portion 129 physically holds the turbomolecular pump 100 and also serves as a heat conduction path. As such, the base portion 129 is preferably made of rigid metal with high thermal conductivity, such as iron, aluminum, or copper.

In this configuration, when the motor 121 drives and rotates the rotor blades 102 together with the rotor shaft 113, the interaction between the rotor blades 102 and the stator blades 123 causes the suction of exhaust gas from the chamber through the inlet port 101. The exhaust gas taken through the inlet port 101 moves between the rotor blades 102 and the stator blades 123 and is transferred to the base portion 129. At this time, factors such as the friction heat generated when the exhaust gas comes into contact with the rotor blades 102 and the conduction of heat generated by the motor 121 increase the temperature of the rotor blades 102. This heat is conducted to the stator blades 123 through radiation or conduction via gas molecules of the exhaust gas, for example.

The stator blade spacers 125 are joined to each other at the outer circumference portion and conduct the heat received by the stator blades 123 from the rotor blades 102, the friction heat generated when the exhaust gas comes into contact with the stator blades 123, and the like to the outside.

In the above description, the threaded spacer 131 is provided at the outer circumference of the cylindrical portion 102d of the rotating body 103, and the thread grooves 131a are engraved in the inner circumference surface of the threaded spacer 131. However, this may be inversed in some cases, and a thread groove may be engraved in the outer circumference surface of the cylindrical portion 102d, while a spacer having a cylindrical inner circumference surface may be arranged around the outer circumference surface.

According to the application of the turbomolecular pump 100, to prevent the gas drawn through the inlet port 101 from entering an electrical portion, which includes the upper radial electromagnets 104, the upper radial sensors 107, the motor 121, the lower radial electromagnets 105, the lower radial sensors 108, the axial electromagnets 106A, 106B, and the axial sensor 109, the electrical portion may be surrounded by a stator column 122. The inside of the stator column 122 may be maintained at a predetermined pressure by purge gas.

In this case, the base portion 129 has a pipe (not shown) through which the purge gas is introduced. The introduced purge gas is sent to the outlet port 133 through gaps between a protective bearing 120 and the rotor shaft 113, between the rotor and the stator of the motor 121, and between the stator column 122 and the inner circumference cylindrical portion of the rotor blade 102.

The turbomolecular pump 100 uses the identification of the model and control based on individually adjusted unique parameters (for example, various characteristics associated with the model). To store these control parameters, the turbomolecular pump 100 includes an electronic circuit portion 141 in its main body. The electronic circuit portion 141 may include a semiconductor memory, such as an EEPROM, electronic components such as semiconductor elements for accessing the semiconductor memory, and a substrate 143 for mounting these components. The electronic circuit portion 141 is housed under a rotational speed sensor (not shown) near the center, for example, of the base portion 129, which forms the lower part of the turbomolecular pump 100, and is closed by an airtight bottom lid 145.

Some process gas introduced into the chamber in the manufacturing process of semiconductors has the property of becoming solid when its pressure becomes higher than a predetermined value or its temperature becomes lower than a predetermined value. In the turbomolecular pump 100A, the pressure of the exhaust gas is lowest at the inlet port 101 and highest at the outlet port 133. When the pressure of the process gas increases beyond a predetermined value or its temperature decreases below a predetermined value while the process gas is being transferred from the inlet port 101 to the outlet port 133, the process gas is solidified and adheres and accumulates on the inner side of the turbomolecular pump 100.

For example, when $SiCl_4$ is used as the process gas in an Al etching apparatus, according to the vapor pressure curve, a solid product (for example, $AlCl_3$) is deposited at a low vacuum (760 [torr] to $10^{-2}$ [torr]) and a low temperature (about 20 [° C.]) and adheres and accumulates on the inner side of the turbomolecular pump 100. When the deposit of the process gas accumulates in the turbomolecular pump 100, the accumulation may narrow the pump flow passage and degrade the performance of the turbomolecular pump 100. The above-mentioned product tends to solidify and adhere in areas with higher pressures, such as the vicinity of the outlet port and the vicinity of the threaded spacer 131.

To solve this problem, conventionally, a heater or annular water-cooled tube 149 (not shown) is wound around the outer circumference of the base portion 129, and a temperature sensor (e.g., a thermistor, not shown) is embedded in the base portion 129, for example. The signal of this temperature sensor is used to perform control to maintain the temperature of the base portion 129 at a constant high temperature (preset temperature) by heating with the heater or cooling with the water-cooled tube 149 (hereinafter referred to as TMS (temperature management system)).

Figure 3:
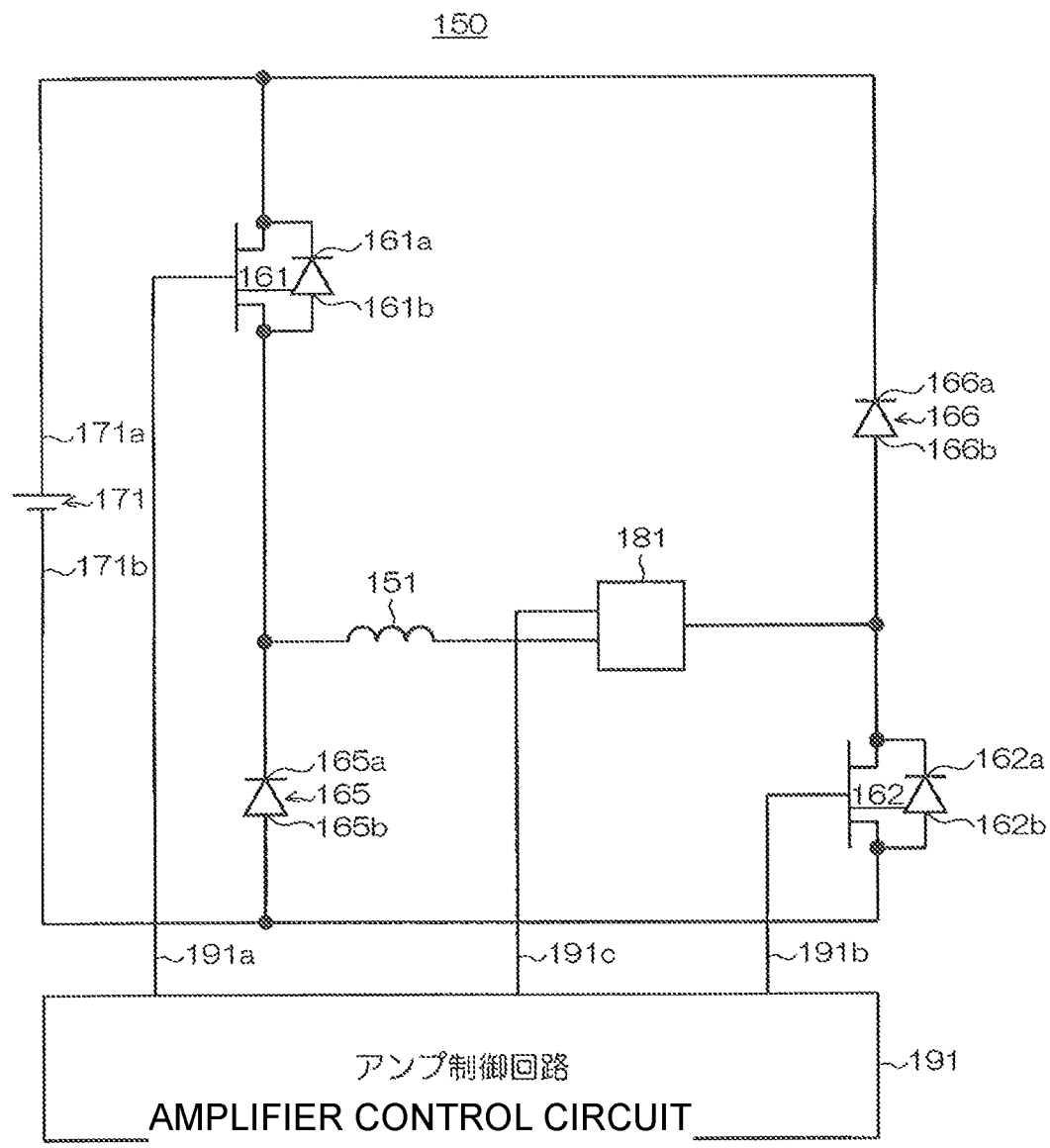
FIG. 3 is a circuit diagram of an amplifier circuit.

The amplifier circuit 150 is now described that controls and excites the upper radial electromagnets 104, the lower radial electromagnets 105, and the axial electromagnets 106A and 106B of the turbomolecular pump 100 configured as described above. FIG. 3 is a circuit diagram of the amplifier circuit.

In FIG. 3, one end of an electromagnet winding 151 forming an upper radial electromagnet 104 or the like is connected to a positive electrode 171a of a power supply 171 via a transistor 161, and the other end is connected to a negative electrode 171b of the power supply 171 via a current detection circuit 181 and a transistor 162. Each transistor 161, 162 is a power MOSFET and has a structure in which a diode is connected between the source and the drain thereof.

In the transistor 161, a cathode terminal 161a of its diode is connected to the positive electrode 171a, and an anode terminal 161b is connected to one end of the electromagnet winding 151. In the transistor 162, a cathode terminal 162a of its diode is connected to a current detection circuit 181, and an anode terminal 162b is connected to the negative electrode 171b.

A diode 165 for current regeneration has a cathode terminal 165a connected to one end of the electromagnet winding 151 and an anode terminal 165b connected to the negative electrode 171b. Similarly, a diode 166 for current regeneration has a cathode terminal 166a connected to the positive electrode 171a and an anode terminal 166b connected to the other end of the electromagnet winding 151 via the current detection circuit 181. The current detection circuit 181 may include a Hall current sensor or an electric resistance element, for example.

The amplifier circuit 150 configured as described above corresponds to one electromagnet. Accordingly, when the magnetic bearing uses 5-axis control and has ten electromagnets 104, 105, 106A, and 106B in total, an identical amplifier circuit 150 is configured for each of the electromagnets. These ten amplifier circuits 150 are connected to the power supply 171 in parallel.

An amplifier control circuit 191 may be formed by a digital signal processor portion (not shown, hereinafter referred to as a DSP portion) of the controller. The amplifier control circuit 191 switches the transistors 161 and 162 between on and off.

The amplifier control circuit 191 is configured to compare a current value detected by the current detection circuit 181 (a signal reflecting this current value is referred to as a current detection signal 191c) with a predetermined current command value. The result of this comparison is used to determine the magnitude of the pulse width (pulse width time Tp1, Tp2) generated in a control cycle Ts, which is one cycle in PWM control. As a result, gate drive signals 191a and 191b having this pulse width are output from the amplifier control circuit 191 to gate terminals of the transistors 161 and 162.

Under certain circumstances such as when the rotational speed of the rotating body 103 reaches a resonance point during acceleration, or when a disturbance occurs during a constant speed operation, the rotating body 103 may operate with positional control at high speed and with a strong force. For this purpose, a high voltage of about 50 V, for example, is used for the power supply 171 to enable a rapid increase (or decrease) in the current flowing through the electromagnet winding 151. Additionally, a capacitor is generally connected between the positive electrode 171a and the negative electrode 171b of the power supply 171 to stabilize the power supply 171 (not shown).

In this configuration, when both transistors 161 and 162 are turned on, the current flowing through the electromagnet winding 151 (hereinafter referred to as an electromagnet current iL) increases, and when both are turned off, the electromagnet current iL decreases.

Also, when one of the transistors 161 and 162 is turned on and the other is turned off, a freewheeling current is maintained. Passing the freewheeling current through the amplifier circuit 150 in this manner reduces the hysteresis loss in the amplifier circuit 150, thereby limiting the power consumption of the entire circuit to a low level. Moreover, by controlling the transistors 161 and 162 as described above, high frequency noise, such as harmonics, generated in the turbomolecular pump 100 can be reduced. Furthermore, by measuring this freewheeling current with the current detection circuit 181, the electromagnet current iL flowing through the electromagnet winding 151 can be detected.

Figure 4:
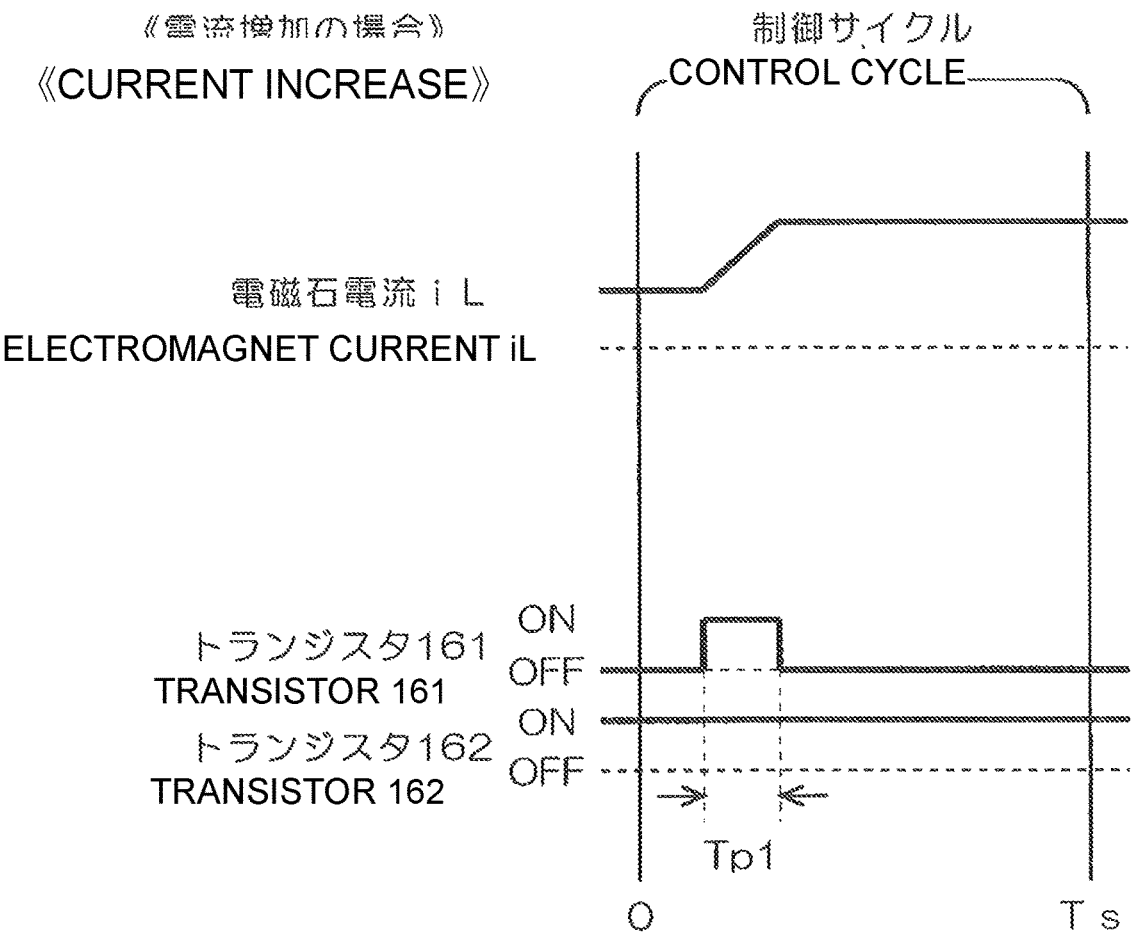
FIG. 4 is a time chart showing control performed when a current command value is greater than a detected value.

That is, when the detected current value is smaller than the current command value, as shown in FIG. 4, the transistors 161 and 162 are simultaneously on only once in the control cycle Ts (for example, 100 s) for the time corresponding to the pulse width time Tp1. During this time, the electromagnet current iL increases accordingly toward the current value iLmax (not shown) that can be passed from the positive electrode 171a to the negative electrode 171b via the transistors 161 and 162.

Figure 5:
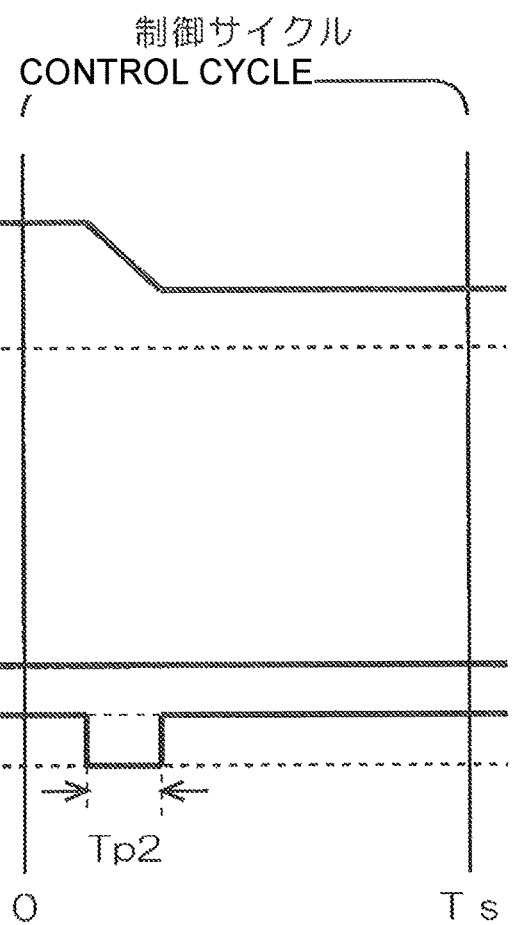
FIG. 5 is a time chart showing control performed when a current command value is less than a detected value.

When the detected current value is larger than the current command value, as shown in FIG. 5, the transistors 161 and 162 are simultaneously off only once in the control cycle Ts for the time corresponding to the pulse width time Tp2. During this time, the electromagnet current iL decreases accordingly toward the current value iLmin (not shown) that can be regenerated from the negative electrode 171b to the positive electrode 171a via the diodes 165 and 166.

In either case, after the pulse width time Tp1, Tp2 has elapsed, one of the transistors 161 and 162 is on. During this period, the freewheeling current is thus maintained in the amplifier circuit 150.

In the turbomolecular pump 100 with the basic configuration described above, the upper side as viewed in FIG. 2 (the side including the inlet port 101) serves as a suction portion connected to the target apparatus, and the lower side (the side including the outlet port 133 protruding leftward as viewed in the figure from the base portion 129) serves as an exhaust portion connected to the cold trap 13, the second vacuum pump 16 (a roughing auxiliary pump (back pump)), and the like. The turbomolecular pump 100 can be used not only in an upright position in the vertical direction shown in FIG. 2, but also in an inverted position, a horizontal position, and an inclined position.

Also, in the turbomolecular pump 100, the above-mentioned outer cylinder 127 and the base portion 129 are combined to form a single case (hereinafter, they may be collectively referred to as a "main body casing" or the like). The turbomolecular pump 100 is electrically (and structurally) connected to a box-shaped electrical case (not shown), and the above-mentioned controller is incorporated in the electrical case.

The configuration within the main body casing (the combination of the outer cylinder 127 and the base portion 129) of the turbomolecular pump 100 may be divided into a rotation mechanism portion, which rotates the rotor shaft 113 and the like with the motor 121, and an exhaust mechanism portion, which is rotationally driven by the rotation mechanism portion. The exhaust mechanism portion may be divided into a turbomolecular pump mechanism portion, which may include the rotor blades 102 and the stator blades 123, and a thread groove pump mechanism portion, which may include the cylindrical portion 102d and the threaded spacer 131.

The above-mentioned purge gas (protection gas) is used to protect components such as the bearing portions and the rotor blades 102, prevents corrosion caused by the exhaust gas (process gas), and cools the rotor blades 102, for example. This purge gas may be supplied by a general technique.

For example, although not illustrated, a purge gas flow passage extending linearly in the radial direction may be provided in a predetermined section of the base portion 129 (for example, at a position approximately 180 degrees apart from the outlet port 133). The purge gas may be supplied to the purge gas flow passage (specifically, a purge port serving as a gas inlet) from the outside of the base portion 129 via a purge gas cylinder (e.g., N2 gas cylinder), a flow rate regulator (valve device), or the like.

The protective bearing 120 described above is also referred to as a "touchdown (T/D) bearing", a "backup bearing", or the like. In case of any trouble such as trouble in the electrical system or entry of air, the protective bearing 120 prevents a significant change in the position and orientation of the rotor shaft 113, thereby limiting damage to the rotor blades 102 and surrounding portions.

In the figures showing the structure of the turbomolecular pump 100 (such as FIG. 2), hatch patterns indicating cross sections of components are omitted to avoid complicating the drawing.

The gas paths and gas state variations in the above-mentioned cleaning apparatus 10 are now described. In the following description of the cleaning apparatus 10, the turbomolecular pump 100 serving as the first vacuum pump 11 is mainly referred to as a "first vacuum pump".

The gas (hereinafter referred to as "discharged gas") sent to the outlet port 133 (FIG. 2) of the first vacuum pump 11 (turbomolecular pump 100) flows into the first piping 21 shown in FIG. 1. The discharged gas flowing into the first piping 21 is directed toward the cold trap 13 or the third piping 23 depending on the state of the switching valve 12.

The discharged gas is directed toward the cold trap 13 when the discharged gas has been heated for cleaning. That is, this example has the function of heating the gas flow passage of the first vacuum pump 11 to gasify and remove deposits (also referred to as "cleaning function" or "cleaning mode"). This cleaning function may be similar to the heating type proposed in Japanese Patent Application No. 2019-165839 by the present applicant.

When the above cleaning function is more specifically applied to the present example, a heater may be provided to perform cleaning by heating the discharged gas to the temperature appropriate for cleaning (sublimation temperature) or higher. In the first vacuum pump 11 (turbomolecular pump 100) of the present example, the heater may be arranged inside or at the outer circumference of the threaded spacer 131 shown in FIG. 2. The threaded spacer 131 is a part of the thread groove pump mechanism portion described above, and may be considered as constituting a drag pump portion.

In addition to the threaded spacer 131, the part on which the heater is set may be the interior or the outer circumference of the base portion 129, for example. Furthermore, heaters may be provided on both the base portion 129 and the threaded spacer 131. The heater may be dedicated to the cleaning function, or the heater of the TMS described above may also be used for the cleaning function.

Various general heaters such as a cartridge heater, a sheath heater, and an electromagnetic induction heater (IH heater) may be used as the heater according to their characteristics. Also, a planar heater or the like may be used that is structured to have a limited degree of three-dimensional protrusion.

The section to be heated by the heater is not limited to the first vacuum pump 11, and may be a certain section in the first piping 21 connecting the first vacuum pump 11 to the cold trap 13, for example. Examples of the certain section in the first piping 21 include a section immediately after the first vacuum pump 11, a section between the first vacuum pump 11 and the switching valve 12, and a section between the switching valve 12 and the cold trap 13. Furthermore, the heater may be installed in one or both of the inside and outside the first piping 21.

The heating by the heater is performed to prevent deposits from being formed in the gas flow passage of the first vacuum pump 11 and the first piping 21, and to perform cleaning to vaporize formed deposits. The gas heated during the cleaning flows from the first vacuum pump 11 to the cold trap 13 via the first piping 21 and is cooled in the cold trap 13.

In the cold trap 13, cooling the gas facilitates the deposition of solids, causing a component (sublimation component) contained in the gas to form deposits. The overall configuration and function of the cleaning apparatus 10 are now described, and the specific configuration of the cold trap 13 and the function of the cold trap 13 to cause deposits to be formed will be described in detail below.

The deposits formed in the cold trap 13 are discharged from the cold trap 13 to the second piping 22 and fall toward the branch pipe 24 via a section 26 where the branch pipe 24 merges with the second piping 22. The on-off valve 14, which is provided in a middle section of the branch pipe 24, opens the space between the cold trap 13 and the deposit collection container 15. The deposits released from the cold trap 13 fall into the deposit collection container 15 through the branch pipe 24 and are collected by the deposit collection container 15.

The above-mentioned second piping 22 connects the cold trap 13 to the second vacuum pump 16. The second vacuum pump 16 is in operating state and assists the first vacuum pump 11 in exhausting gas. Most of the gas from which deposits have been formed in the cold trap 13 flows toward the second piping 22 due to the operation of the second vacuum pump 16 and is exhausted by the second vacuum pump 16.

In contrast, when cleaning is not performed (for example, during a process such as semiconductor manufacturing), the gas path is switched using the switching valve 12 placed at the section where the first piping 21 merges with the third piping 23. The second vacuum pump 16 is in operation state as described above and assists the first vacuum pump 11 in exhausting gas. The discharged gas of the first vacuum pump 11 is directed to the third piping 23, flows into the second piping 22 from a section 27 where the third piping 23 merges with the second piping 22, and is exhausted by the second vacuum pump 16.

The specific configuration of the cold trap 13 and the details of the function of the cold trap 13 to cause deposits to be formed are now described. As shown in the vertical cross-sectional view of FIG. 6, the cold trap 13 includes a casing 201, an inlet port 202, an outlet port 203, a cooling mechanism portion 204, a motor 205, and the like. In the figures showing the structure of the cold trap 13 (such as FIGS. 6 to 8), hatch patterns indicating cross sections of components are omitted to avoid complicating the drawing.

Of the components, the casing 201 is formed by combining a cylindrical casing main body 211 and a disc-shaped lid portion 212. The casing main body 211 has an integral top plate portion 213, which closes one axial end (the upper part as viewed in the figure) of the casing main body 211.

The lid portion 212 is a component separate from the casing main body 211 and is coupled to the casing main body 211 with a fixture (such as a hexagon socket head bolt) (not shown). The lid portion 212 airtightly closes the other axial end (the lower part as viewed in the figure) of the casing main body 211.

The top plate portion 213 of the casing main body 211 has an inlet hole 214 extending through the top plate portion 213 in the thickness direction. Tubular inlet-side piping 215 is joined to the section including the inlet hole 214 from the outside of the top plate portion 213. This inlet-side piping 215 forms the above-mentioned inlet port 202. The inlet port 202 is separated in a radial direction from an axis B of the casing 201 (indicated by the dashed dotted line in the figure) and extends substantially parallel to the axis B of the casing 201.

The lid portion 212 has an outlet hole 217 extending through the lid portion 212 in the thickness direction. Tubular outlet-side piping 218 is joined to the section including the outlet hole 217 from the outside of the lid portion 212. This outlet-side piping 218 forms the above-mentioned outlet port 203. The outlet hole 217 and the outlet port 203 form a deposit discharge port (reference numeral omitted). It is also possible to consider that only the outlet hole 217 serves as the deposit discharge port.

The outlet port 203 is separated in a radial direction from the axis B of the casing 201 and extends substantially parallel to the axis B of the casing 201. The outlet port 203 extends in the direction opposite to the inlet port 202 in terms of the axial directions of the casing 201. In terms of the circumferential directions of the casing 201, the phase of the outlet port 203 differs by 180 degrees from the phase of the inlet port 202.

The cooling mechanism portion 204 includes a rotating shaft (rotor shaft of the cold trap 13) 221, scraping portions 222, disc-shaped components 223, bearing portions 224 and 225, and the like, and is housed in the casing 201.

The motor 205 is fixed to the lid portion 212 of the casing 201 from the outside, and its output shaft (not shown) is inserted in the rotating shaft 221 of the cooling mechanism portion 204. The output shaft (not shown) of the motor 205 is coaxially connected to the rotating shaft 221. The motor 205 may be any one of various motors.

The rotating shaft 221 of the cooling mechanism portion 204 is a columnar component with stages, and its axis (reference numeral omitted) is substantially aligned with the axis B of the casing 201. One axial end of the rotating shaft 221 (the upper part as viewed in the figure) is rotationally supported by the casing main body 211 via the bearing portion 224 on the inlet side. The other axial end of the rotating shaft 221 (the lower part as viewed in the figure) is rotationally supported by the lid portion 212 via the bearing portion 225 on the outlet side.

Each scraping portion (also referred to as a "scraper") 222 is a rod-shaped member having a rectangular cross section, and is formed integrally with the rotating shaft 221 (or may be a separate member coupled to the rotating shaft 221). The scraping portions 222 are formed in multiple stages (seven stages in this example), each including a set of two scraping portions 222 extending in the opposite radial directions of the rotating shaft 221. In the example shown in FIG. 6, seven sets (14 portions in total) of scraping portions 222 are formed at substantially equal intervals in the axial direction of the rotating shaft 221.

That is, as shown in FIGS. 6 and 7, the scraping portions 222 of each set are formed to be positioned on the same straight line with a 180-degree phase difference. Also, the scraping portions 222 of each set extend substantially linearly symmetrically about the axis of the rotating shaft 221 (aligned with the axis B of the casing 201 in this example).

The positional relationship of the seven sets of scraping portions 222 is such that they are arranged in the same phase in the circumferential direction of the rotating shaft 221, and arranged substantially evenly in the axial direction of the rotating shaft 221. When the motor 205 is driven and rotates the rotating shaft 221 in a predetermined direction, the scraping portions 222 are rotationally displaced about the rotating shaft 221 integrally with the rotating shaft 221.

The rotation direction of the motor 205 and the rotating shaft 221 may be either clockwise or counterclockwise as viewed in FIG. 8. The motor 205 may also be controlled to rotate in a direction opposite to the normal direction of rotation according to the situation.

When the scraping portions 222 are formed separately from the rotating shaft 221 and coupled to the rotating shaft 221, the scraping portions 222 may be formed on the outer circumference surface of a tubular component (not shown), and the rotating shaft 221 may be inserted into and fixed to this tubular component, for example. In another example, some of the scraping portions 222 (e.g., one to three sets) may be formed on a tubular component, and a plurality of tubular components may be fixed to the rotating shaft 221.

The disc-shaped components 223 are stacked in multiple stages (six stages in this example) in the casing 201. Each disc-shaped component 223 is processed into a disc of a perfect circle as shown in FIGS. 6 and 8. The outer circumference portion of the disc-shaped component 223 serves as a thick spacer 231. The disc-shaped components 223 are stacked in the axial direction of the casing 201. The spacers 231 secure gaps of a predetermined size between the disc-shaped components 223 to form a plurality of deposit transfer clearances 232 (FIG. 7).

Furthermore, a deposit transfer clearance 232 is formed between the top plate portion 213 of the casing main body 211 and the disc-shaped component 223 facing the top plate portion 213 (in the top stage in FIGS. 6 and 7). Although the enlarged illustration is omitted, a deposit transfer clearance 232 is also formed between the lid portion 212 and the disc-shaped component 223 facing the lid portion 212 (the lowest stage as viewed in FIG. 6). Six disc-shaped components 223 are sandwiched between the top plate portion 213 of the casing main body 211 and the lid portion 212, and fixed in the casing 201.

The section of each disc-shaped component 223 inward of the spacer 231 (also referred to as "radial inner side" or "inner circumference side") serves as a cooling portion 233 having the shape of a perfect circle. This cooling portion 233 has a substantially constant thickness that is thinner than the spacer 231.

The cooling portion 233 has a transfer hole 234, which is shaped in a perfect circle as an opening to transfer deposits. Each disc-shaped component 223 has one transfer hole 234. The transfer hole 234 is provided at the outer circumference edge (outermost circumference portion) of the cooling portion 233 and is positioned in a section located at a very small distance from the spacer 231 (section of the inner circumference side). As shown in FIG. 8, the positional relationship between the scraping portion 222 and the transfer hole 234 is set such that, when the scraping portion 222 is positioned to intersect the central part of the transfer hole 234, the distal end of the scraping portion 222 reaches the outermost circumference portion of the transfer hole 234 and substantially overlaps the outermost circumference portion of the transfer hole 234.

The transfer holes 234 in the six disc-shaped components 223 are arranged such that transfer holes 234 that differ in phase in the circumferential direction of the cooling portion 233 by 180 degrees alternate. That is, the transfer holes 234 are located in the same phase in the first (the closest to the inlet hole 214), third, and fifth disc-shaped components 223 from the inlet hole 214. In FIG. 6, these transfer holes 234 are located at the right side of the rotating shaft 221 and aligned in the same straight line.

In contrast, in the second, fourth, and sixth disc-shaped components 223 from the inlet hole 214, the transfer holes 234 are located at the opposite side of the rotating shaft 221 (at the left side of the rotating shaft 221 as viewed in FIG. 6) and aligned in the same straight line.

FIG. 8 shows a cross section that is radially cut along line A-A at a position between the first and second disc-shaped components 223 from the inlet hole 214 in FIG. 6. In FIG. 8, the transfer hole 234 indicated by a solid line (the transfer hole 234 shown on the left side in the figure) is formed in the second disc-shaped component 223 from the inlet hole 214. The transfer hole 234 indicated by the broken line (hidden line) (the transfer hole 234 shown on the right side in the figure) is formed in the third disc-shaped component 223.

The distance between the plate surface of a cooling portion 233 and a scraping portion 222 is set such that, when the rotating shaft 221 rotates and displaces the scraping portion 222 relative to the plate surface of the cooling portion 233, the scraping portion 222 does not come in contact with the plate surface of the cooling portion 233 with an excessive pressure that hinders the displacement of the scraping portion 222.

In FIGS. 6 and 7, the size of the gap between the plate surface of the cooling portion 233 and the scraping portion 222 is enlarged for emphasis for ease of identification of the presence of the two members (the scraping portion 222 and the cooling portion 233). It is also possible to bring the scraping portion 222 into contact with the plate surface of the cooling portion 233 with a pressure that allows the scraping portion 222 to be smoothly displaced. Furthermore, the material of the scraping portion 222 may be a thin plate of metal, or a synthetic resin having sufficient hardness and flexibility.

Reference numeral 236 in FIG. 6 denotes a cooling pipe embedded in the lid portion 212. The cooling pipe 236 is a circular pipe having a perfectly circular cross section, and is arranged in the lid portion 212 in the circumferential direction. Cooling liquid (for example, cooling water) flows through the cooling pipe 236. The temperature of the cooling liquid is transmitted to the cooling pipe 236, the lid portion 212, and the disc-shaped components 223, maintaining the temperature of the cooling portions 233 substantially constant.

That is, the cooling pipe 236, the lid portion 212, and the spacers 231 of the disc-shaped components 223 are coupled to the cold trap 13 in contact with one another in a manner that allows for efficient heat transfer. The heat of the cooling pipe 236 is transmitted and conducted to the cooling portions 233 of the disc-shaped components 223 via the lid portion 212 and the spacers 231.

In FIG. 6, a plurality of arrows C (bold lines) schematically indicates the path of gas flowing through the cold trap 13. Inside the cold trap 13, the gas discharged from the first vacuum pump 11 (hereinafter referred to as "discharged gas") is introduced into the inlet hole 214 via the inlet-side piping 215. The discharged gas is then introduced into the deposit transfer clearance 232 that is spatially connected to the inlet hole 214.

The discharged gas spreads in the deposit transfer clearance 232 while being in contact with the plate surface of the cooling portion 233. The discharged gas then moves beyond the section including the rotating shaft 221 and reaches the opposite side with respect to the rotating shaft 221. The discharged gas passes through the transfer hole 234 formed in the cooling portion 233 of the next stage and then enters the deposit transfer clearance 232 of the subsequent stage.

In this manner, the discharged gas flows within deposit transfer clearances 232, successively passes through transfer holes 234, and spreads in the subsequent deposit transfer clearances 232. Upon reaching the outlet hole 217 of the lid portion 212, the discharged gas is directed to the outside of the cold trap 13 through the outlet port 203.

In the cold trap 13, the discharged gas also comes into contact with the cooling portions 233 so that heat is exchanged between the discharged gas and the cooling portions 233. The cooling portions 233 lower the temperature of the discharged gas, so that a component in the discharged gas is solidified to form deposits. The scraping portions 222, which are rotationally displaced, collide with and forcibly remove the formed deposits from the disc-shaped components 223. The disc-shaped components 223 may also crush the deposits into lumps or powder.

Figure 9:
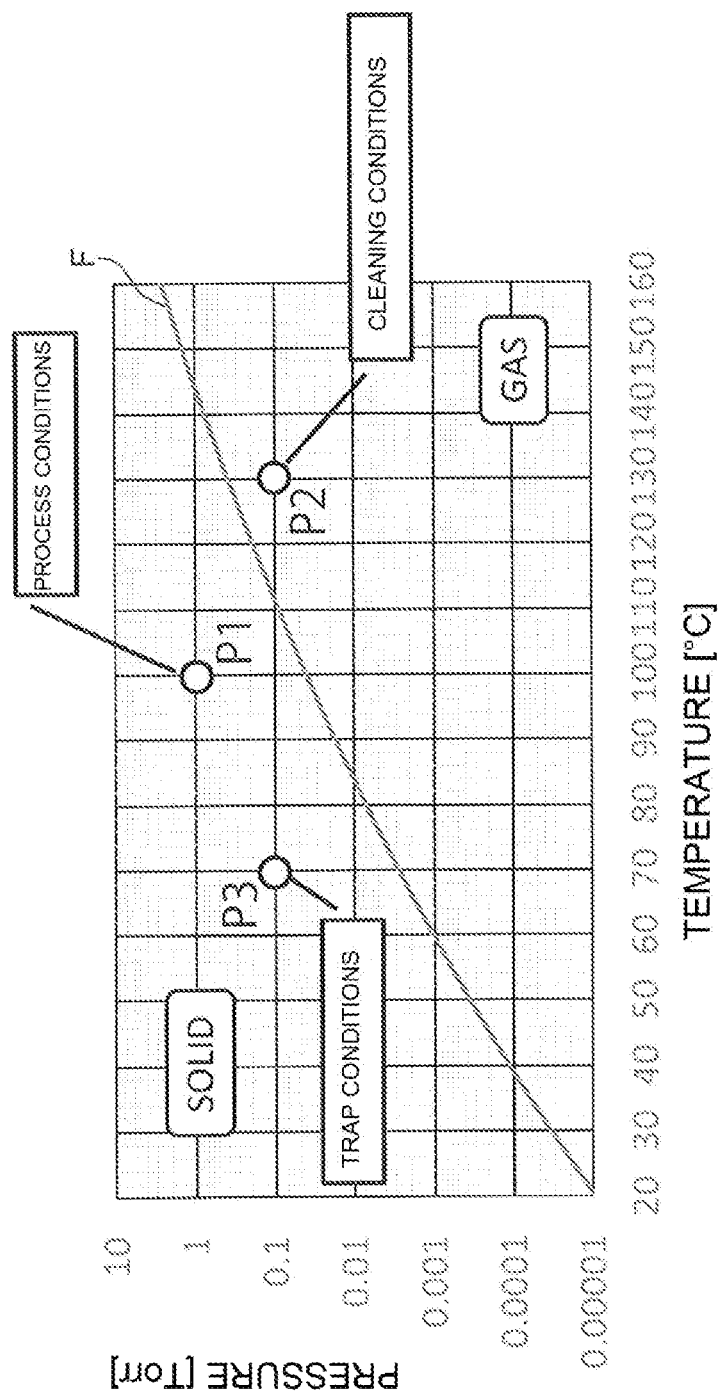
FIG. 9 is an explanatory diagram illustrating the function of the cold trap.

FIG. 9 is a semilogarithmic graph illustrating the function of the cold trap 13. In the graph of FIG. 9, the horizontal axis represents temperature [° C.], and the vertical axis represents pressure [Torr]. Reference symbol F in FIG. 9 indicates a sublimation curve relating to a component in the exhaust gas. The upper side of the sublimation curve F is the region in which the component in the exhaust gas becomes "SOLID", and the lower side of the sublimation curve F is the region in which the component in the exhaust gas becomes "GAS".

Reference numeral P1 in FIG. 9 indicates process conditions. The process conditions refer to the environmental conditions (process conditions) in which a predetermined process using a process gas is performed in the exhaust target apparatus (not shown) of the first vacuum pump 11 (turbomolecular pump 100). In this example, the process conditions include a temperature of 100 [° C.] and a pressure of 1 [Torr]. This point P1 is located in the "SOLID" region. Thus, under the process conditions, deposits are formed from the component in the process gas.

Reference numeral P2 in FIG. 9 indicates cleaning conditions. The cleaning conditions refer to the conditions for cleaning of formed deposits. In this example, the cleaning conditions include a temperature of 130 [° C.] and a pressure of 0.1 [Torr]. This point P2 is located in the "GAS" region. Thus, the deposits are vaporized under the cleaning conditions.

Reference numeral P3 in FIG. 9 indicates trap conditions. The trap conditions refer to the conditions for causing deposits to be formed in the cold trap 13. In this example, the trap conditions include a temperature of 70 [° C.] and a pressure of 0.1 [Torr], which is the same as the cleaning conditions. This point P3 is located in the "SOLID" region. Thus, deposits are formed by placing the gas (discharged gas) in an environment of the trap conditions.

The cooling of the discharged gas by the cold trap 13 (P3) is performed after cleaning (P2). In the example of FIG. 9, after the cleaning (P2), the cold trap 13 lowers the temperature of the discharged gas. The cold trap 13 actively solidifies the component in the discharged gas that can become deposits (also referred to as "sublimation component" or "deposit component"). As a result, the sublimation component is removed from the discharged gas flowing from the first vacuum pump 11 to the second vacuum pump 16. This prevents the adherence of deposits in the gas path from the first vacuum pump 11A to the second vacuum pump 16 and gas flow passage in the second vacuum pump 16 and the like.

The temperatures and pressures of the cleaning conditions P2 and the trap conditions P3 in FIG. 9 are only examples and may be changed in various manners according to the sublimation curve F and the process conditions P1. However, the cleaning conditions P2 and the trap conditions P3 may be set such that the cleaning conditions P2 are positioned in the "GAS" region and the trap conditions P3 are positioned in the "SOLID" region.

The cleaning apparatus 10 for a vacuum exhaust system described above has the cold trap 13, which is cooled to the sublimation temperature of the sublimation component of the gas or below. The cold trap 13 thus actively causes the gas discharged from the first vacuum pump 11 to form deposits. As described above, this allows for the prevention of deposit adherence in the piping downstream of the cold trap 13, the second vacuum pump 16, and the like.

Furthermore, the switching valve 12 and the third piping 23 are provided, allowing the discharged gas to flow toward the third piping 23, to bypass the cold trap 13, and to be directed toward the second vacuum pump 16 during a process such as semiconductor manufacturing, for example. As a result, the cold trap 13 and the like are prevented from becoming resistance (also referred to as "flow resistance" or "exhaust resistance") against the flow of gas.

The cold trap 13 includes the disc-shaped components 223 and the cooling pipe 236 in the casing 201. This allows the disc-shaped components 223 to be cooled in a suitable manner, thus efficiently causing deposits to be formed in the cold trap 13.

The cold trap 13 is constructed by stacking a plurality of disc-shaped components 223 having transfer holes 234 with the transfer holes 234 positioned in different phases. Accordingly, the deposits formed on a disc-shaped component 223 can be delivered (sent out) into the next stage via the transfer hole 234.

Additionally, the cold trap 13 includes the rotating shaft 221 provided in the casing 201 and the scraping portions 222 fixed to the rotating shaft 221. The scraping portions 222 are rotatable along the plate surfaces of the disc-shaped components 223 and thus capable of scraping off the deposits formed on the disc-shaped components 223. The scraping portions 222 can also direct the deposits to the subsequent stages through the transfer holes 234.

Furthermore, the branch pipe 24 disposed in the second piping 22, the on-off valve 14 disposed in the branch pipe 24, and the deposit collection container 15 disposed downstream of the on-off valve 14 are provided, allowing the deposits formed in the cold trap 13 to be sent to the deposit collection container 15 via the branch pipe 24 and the on-off valve 14.

The outlet hole 217 and the outlet port 203, which are disposed in the casing 201 of the cold trap 13, the on-off valve 14 disposed downstream of the outlet hole 217 and the outlet port 203, and the deposit collection container 15 disposed downstream of the on-off valve 14 are also provided, allowing the deposits formed in the casing 201 to be sent to the deposit collection container 15 via the outlet hole 217, the outlet port 203, and the on-off valve 14.

The present disclosure is not limited to the examples described above and can be modified in various forms. For example, the switching valve 12 and the third piping 23 may be omitted, and it may be configured so as not to allow the discharged gas of the first vacuum pump 11 to bypass and flow to the third piping 23. However, in this case, as described above, the cold trap 13 becomes exhaust resistance during a process such as semiconductor manufacturing. For this reason, a configuration including the switching valve 12 and the third piping 23 can exhaust gas more efficiently than a configuration without them.

To facilitate the transfer of deposits toward the outlet port 203 in the cold trap 13, the deposits may be agitated and/or crushed by varying and increasing the rotation speed of the scraping portions 222 and/or by rotating the scraping portions 222 forward and backward, for example.

The shape of each scraping portion 222 is not limited to a rod shape, and may be modified in various forms such as a plate shape or a shape having a polygonal (pentagonal, hexagonal, octagonal, etc.) cross section.

Each stage includes two scraping portions 222. However, the present disclosure is not limited to this, and each stage may include one or three or more scraping portions 222. In this case, it is desirable to determine the arrangement of the scraping portions 222 in each group or the whole in consideration of the overall balance during rotation.

The number of scraping portions 222 in each stage of the above cold trap 13 is as few as two. This prevents the scraping portions 222 from becoming excessive exhaust resistance against the discharged gas flowing through the deposit transfer clearances 232.

The number of transfer holes 234 is one for each disc-shaped component 223, but the number of transfer holes 234 is not limited to this and may be two or more. Also, the opening area of the transfer hole 234 may be increased as much as possible. An increased opening area of the transfer hole 234 increases the efficiency in transferring deposits to the next stage.

However, an increased opening area of the transfer hole 234 also reduces the area of the cooling portion 233 in the disc-shaped component 223 capable of cooling (cooling area). As such, the number and the opening area of the transfer holes 234 (the total opening area when there are multiple transfer holes 234) are preferably set to the level that allows the discharged gas to be in contact with the plate surface of each disc-shaped component 223 for a duration that is long enough for suitable cooling.

In the first example, the cold trap 13 is configured such that the discharged gas is introduced from above and the deposits are discharged from below, but the cold trap 13 is not limited to this. For example, although not shown, the cold trap may have a structure that receives the discharged gas in a horizontal direction.

Although not shown, the cold trap may include a rotating member rotatable about a horizontal axis and a thread groove formed in this rotating member, and the thread groove may be configured to push deposits out. The deposits may be transferred and discharged in a horizontal direction in this manner. However, as described above, transferring deposits from top to bottom facilitates the transfer by taking advantage of the weight of the deposits. This enables the structure of the cold trap to be simplified.

The present disclosure can also adopt various examples as described below. In the following description, same reference numerals are given to those configurations that are the same as the first example. The descriptions of such configurations are omitted as appropriate.

Figure 10:
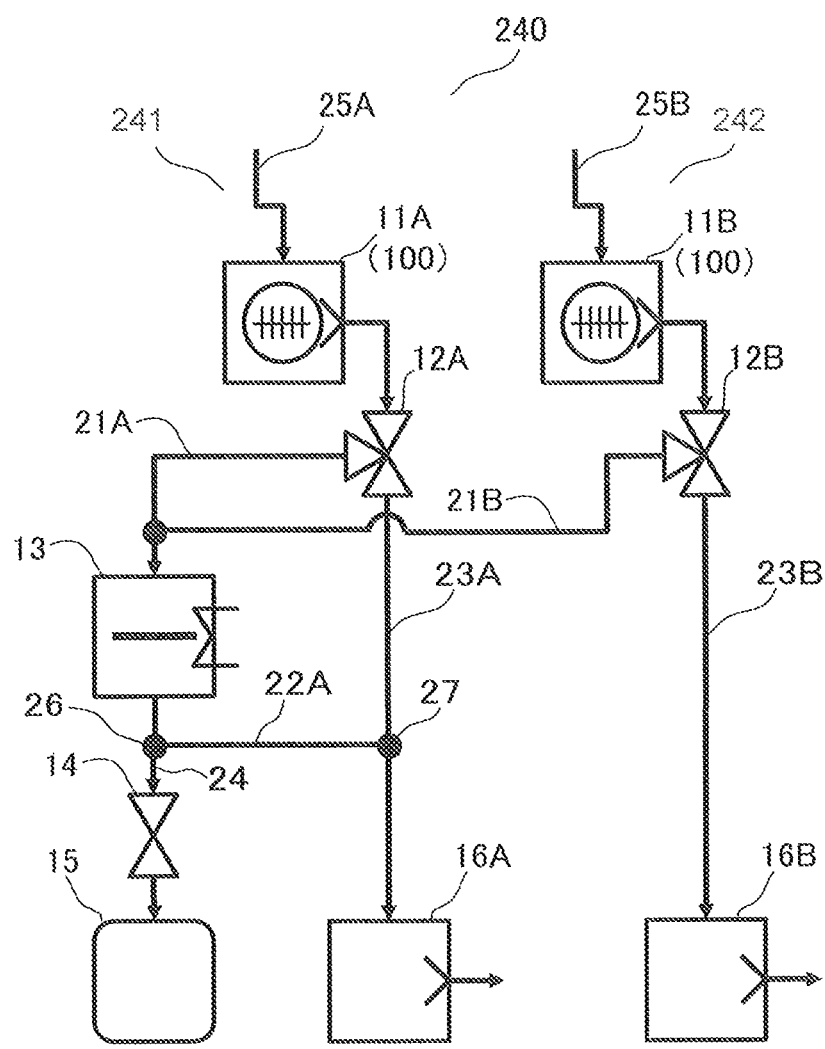
FIG. 10 is a block diagram schematically showing a cleaning apparatus for a vacuum exhaust system according to a second example of the present disclosure.

For example, FIG. 10 schematically shows a cleaning apparatus 240 for a vacuum exhaust system according to a second example of the present disclosure. The cleaning apparatus 240 of the second example is of a type having two vacuum exhaust systems, which are similar to that of the first example, in a substantially parallel configuration.

As shown in FIG. 10, the vacuum exhaust system on one side (left side as viewed in the figure) (hereinafter referred to as a "first exhaust system") 241 has a first vacuum pump 11A and a second vacuum pump 16A. The vacuum exhaust system on the other side (right side as viewed in the figure) (hereinafter referred to as a "second exhaust system") 242 has a first vacuum pump 11B and a second vacuum pump 16B.

Of these, the first exhaust system 241, which is the vacuum exhaust system on one side, has devices including the first vacuum pump 11A, a switching valve 12A, a cold trap 13, an on-off valve 14, a deposit collection container 15, and the second vacuum pump 16A in the same manner as the cleaning apparatus 10 (FIG. 1) according to the first example described above.

The first vacuum pump 11A is connected to the cold trap 13 via first piping 21A, and a switching valve 12A is arranged in the middle of the first piping 21A. The cold trap 13 is connected to the second vacuum pump 16A via second piping 22A. The second piping 22A is connected to the deposit collection container 15 via a branch pipe 24, and the on-off valve 14 is arranged in the middle of the branch pipe 24. The switching valve 12A is connected to the second piping 22A via third piping 23A.

These devices may be the same as the first vacuum pump 11, the switching valve 12, the cold trap 13, the on-off valve 14, the deposit collection container 15, and the second vacuum pump 16 of the cleaning apparatus 10 of the first example (FIG. 1). The first vacuum pump 11A may be a turbomolecular pump 100 that is the same as that of the first example.

Also, the first piping 21A, the second piping 22A, the third piping 23A, and the branch pipe 24 may be the same as the first piping 21, the second piping 22, and the third piping 23, and the branch pipe 24 of the cleaning apparatus 10 according to the first example (FIG. 1). Fourth piping 25 is connected to the inlet side of the first vacuum pump 11A. This fourth piping 25 may also be similar to that of the first example.

The first exhaust system 241 also has the same cleaning function as the first example. The first vacuum pump 11A (or a section of the first piping 21A) heats gas to vaporize deposits. The heated gas is then cooled by the cold trap 13.

The deposit collection container 15 collects the formed deposits in the same manner as the first example.

As such, as in the first example described above, the sublimation component, which can become deposits, can be removed from the discharged gas flowing from the first vacuum pump 11A to the second vacuum pump 16. This allows for the prevention of deposit adherence in the gas path between the first vacuum pump 11A and the second vacuum pump 16 and in the gas flow passage of the second vacuum pump 16, for example.

The first piping 21A of the first exhaust system 241 is connected with the first piping 21B of the second exhaust system 242. The second exhaust system 242 includes the first vacuum pump 11B and the second vacuum pump 16B described above. The first vacuum pump 11B is connected to the above-mentioned cold trap 13 via the first piping 21B.

A switching valve 12B is arranged in the middle of the first piping 21B. This is the same as in the first exhaust system 241. However, the second exhaust system 242 is configured such that the second vacuum pump 16B is not connected to the downstream side of the cold trap 13. In the second exhaust system 242, the third piping 23B connected to the switching valve 12B extends to the second vacuum pump 16B and reaches the second vacuum pump 16B.

The second exhaust system 242 also has the same cleaning function as the first exhaust system 241 and is thus capable of heating gas to vaporize deposits. The heated gas flows through the switching valve 12B into the first piping 21B and then flows into the first piping 21A of the first exhaust system 241.

The cold trap 13 cools the gas (discharged gas) flowing into the first piping 21A. The deposit collection container 15 collects the formed deposits. The discharged gas from which the sublimation component, which can become deposits, has been removed flows toward the second vacuum pump 16A by the exhaust action of the second vacuum pump 16A of the first exhaust system 241, and is sent out from the second vacuum pump 16A.

According to the cleaning apparatus 240 of the second example, in addition to the advantageous effects of the disclosure as with the first example, a plurality of exhaust systems (the first and second exhaust systems 241 and 242 in this example) can be provided. The plurality of exhaust systems can share the cold trap 13, the deposit collection container 15, and the like. As such, with the plurality of (two in this example) exhaust systems, the number of cold traps 13 and the like can be reduced, simplifying the cleaning structure for the discharged gas.

Figure 11:
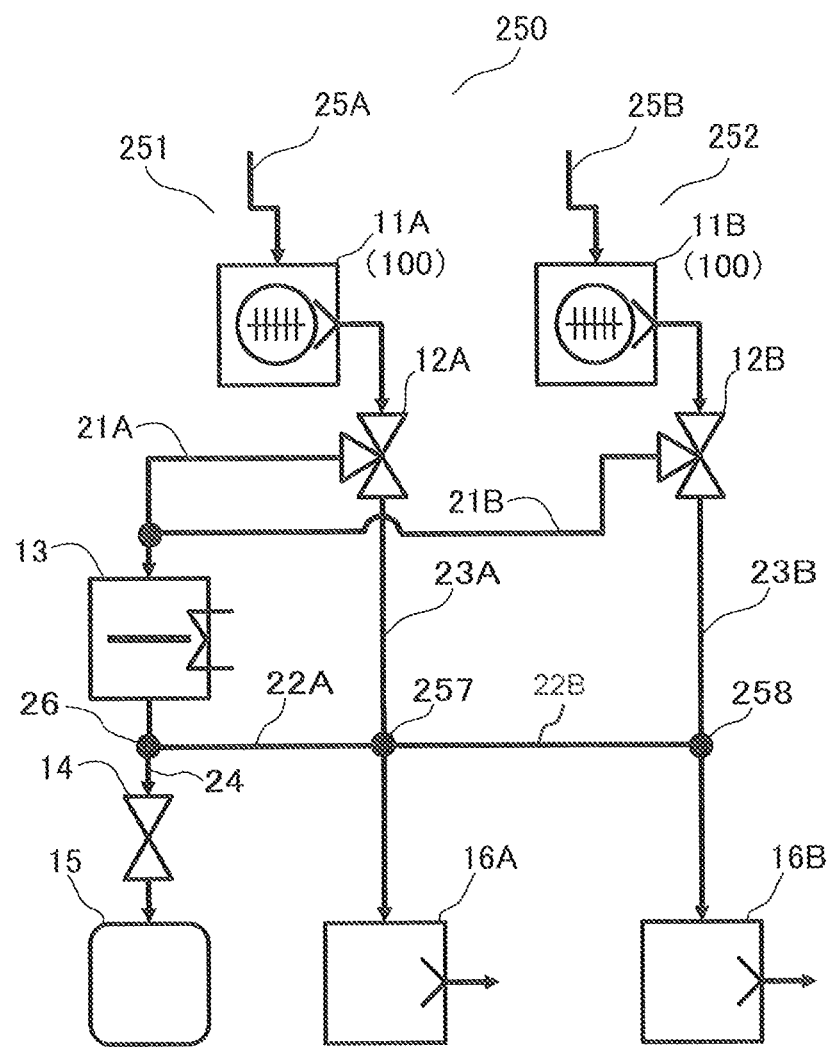
FIG. 11 is a block diagram schematically showing a cleaning apparatus for a vacuum exhaust system according to a third example of the present disclosure.

Referring to FIG. 11, a cleaning apparatus 250 for a vacuum exhaust system according to a third example of the present disclosure is now described. Same reference numerals are given to those configurations that are the same as the above examples. The descriptions of such configurations are omitted as appropriate.

The cleaning apparatus 250 according to the third example is the same as the cleaning apparatus 240 according to the second example in that it includes two exhaust systems (a first exhaust system 241 and a second exhaust system 242). However, in the cleaning apparatus 250 according to the third example, the second piping 22 of the first exhaust system 241 is branched toward the second exhaust system 242 at a section 257 where the second piping 22A merges with the third piping 23A and extends toward the third piping 23B of the second exhaust system 242.

That is, in the cleaning apparatus 240 according to the second example, of the second vacuum pumps 16A and 16B, only the second vacuum pump 16A of the first exhaust system 241 is connected to the downstream side of the cold trap 13. In contrast, in the cleaning apparatus 250 according to the third example, the second vacuum pump 16B of the second exhaust system 242 is also connected to the downstream side of the cold trap 13 via an extension portion 22B of the first exhaust system 241 from the second piping 22 and the third piping 23B.

According to the cleaning apparatus 250 of the third example, in addition to the advantageous effects of the disclosure as with the first example, the second vacuum pump 16B of the second exhaust system 242 is also usable to exhaust the gas cooled by the cold trap 13, thereby improving the overall exhaust capability of the cleaning apparatus 250.

With the cleaning apparatus 250 of the third example, the section of the third piping 23B of the second exhaust system 242 that is located downstream of the merging section 258 with the extension portion 22B (the side connected to the second vacuum pump 16B) may be classified as the second piping of the second exhaust system 242 together with the extension portion 22B. Also, in the cleaning apparatus 250 of the third example, it is possible to consider that the first and second exhaust systems 241 and 242 share a part of the second piping.

Figure 12:
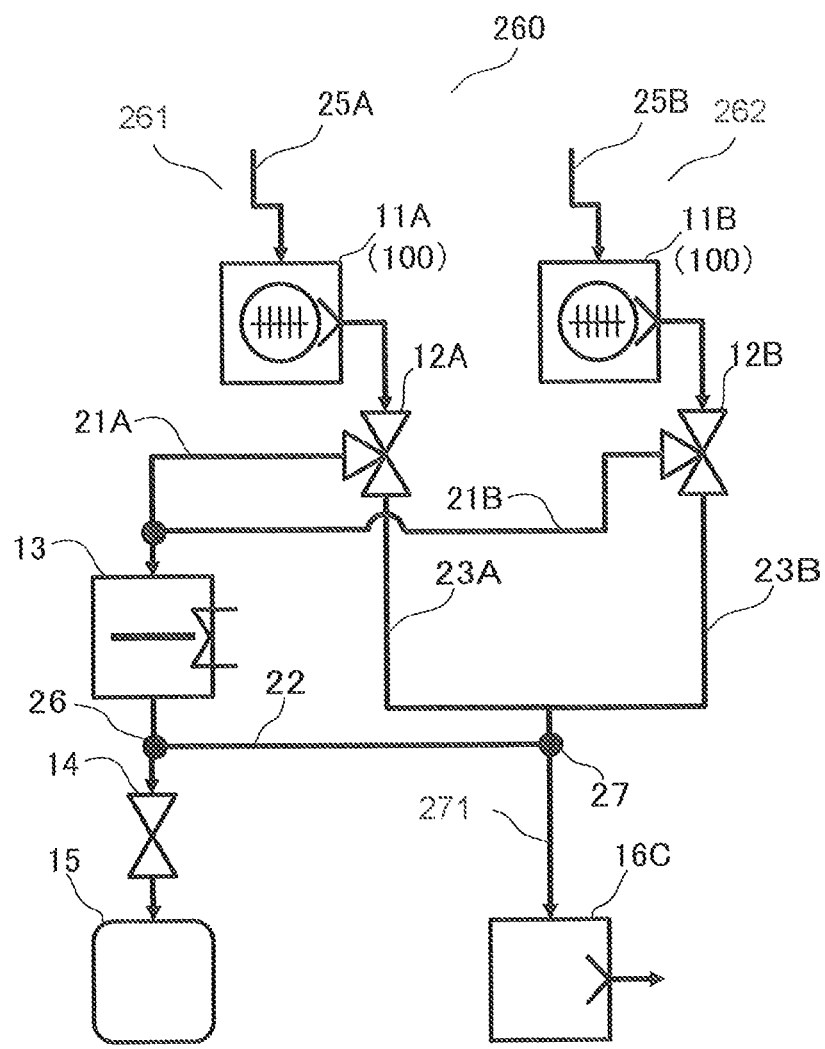
FIG. 12 is a block diagram schematically showing a cleaning apparatus for a vacuum exhaust system according to a fourth example of the present disclosure.

Referring to FIG. 12, a cleaning apparatus 260 for a vacuum exhaust system according to a fourth example of the present disclosure is now described. Same reference numerals are given to those configurations that are the same as the above examples. The descriptions of such configurations are omitted as appropriate.

The cleaning apparatus 260 according to the fourth example is the same as the cleaning apparatus 240 according to the second example and the cleaning apparatus 250 according to the third example in that it includes two exhaust systems (a first exhaust system 241 and a second exhaust system 242). However, in the cleaning apparatus 260 according to the fourth example, the first and second exhaust systems 241 and 242 share one second vacuum pump 16C.

Also, in the cleaning apparatus 260 according to the fourth example, the third piping 23A of the first exhaust system 241 merges at the halfway with the third piping 23B of the second exhaust system 242, and single common piping 261 is connected to the second vacuum pump 16C. Furthermore, the second piping 22A of the first exhaust system 241 merges with the common piping 261, and the discharged gas of both the first and second exhaust systems 241 and 242 passes through the cold trap 13 and is exhausted from the second vacuum pump 16C.

According to the cleaning apparatus 250 of the fourth example as described above, in addition to the advantageous effects of the disclosure as with the first example, the number of the second vacuum pumps (16C) and the like can be reduced in a plurality of (two in this example) of exhaust systems, thereby simplifying the cleaning structure for the discharged gas.

In the cleaning apparatus 260 according to the fourth example, the first exhaust system 2451 and the second exhaust system 2452 share one second vacuum pump 16C. As such, the second vacuum pump 16C is preferably of a larger size (of a larger flow rate) than the second vacuum pumps 16, 16A, and 16B used in the first to third examples.

The present disclosure is not limited to the examples of the present disclosure described above, and various modifications are possible. For example, the first vacuum pump 11 (11A, 11B) is connected to the cold trap 13 via the first piping 21 (21A, 21B), but the present disclosure is not limited to this. For example, the cold trap 13 may be directly connected to the outlet port 133 (FIG. 2) of the first vacuum pump 11 (11A, 11B).

In this case, the outlet port 133 (FIG. 2) of the first vacuum pump 11 (11A, 11B) may be connected to the inlet-side piping 215 of the cold trap 13 or to the inlet hole 214 of the cold trap 13.

The cooling pipe 236 is used to cool the disc-shaped components 223 in the cold trap 13. However, the present disclosure is not limited to this, and the cooling may be achieved using various general cooling means. For example, the cooling means may be a Peltier device (not shown), and the temperature control of the cold trap 13 may be achieved by controlling the activation of the Peltier device.

Furthermore, the valve devices in the cleaning apparatuses 10, 240, 250, and 260 are not limited to the switching valves 12, 12A, 12B and the on-off valve 14, and valve devices having useful functions can be added as appropriate.

What is claimed is:

1. A cleaning apparatus for a vacuum exhaust system that exhausts gas, the cleaning apparatus comprising:
    a cold trap capable of causing deposits to be formed by cooling gas containing a sublimation component;
    at least one first vacuum pump disposed upstream of the cold trap;
    at least one first exhaust path connecting the first vacuum pump to the cold trap;
    at least one second vacuum pump disposed downstream of the cold trap; and
    at least one second exhaust path connecting the second vacuum pump to the cold trap, wherein
    at least a part of the first vacuum pump or the first exhaust path is configured to be heated to higher than or equal to a sublimation temperature of the sublimation component, and
    the cold trap is configured to be cooled to less than or equal to the sublimation temperature of the sublimation component,
    the cold trap includes:
        a casing having an inlet port and an outlet port,
        at least one disc-shaped component disposed in the casing,
        a cooling mechanism configured to cool the disc-shaped component,
        a rotating shaft disposed in the casing, and
        at least one scraping portion fixed to the rotating shaft, the at least one scraping portion configured to be rotatable along a plate surface of the disc-shaped component.

2. The cleaning apparatus for a vacuum exhaust system according to claim 1,
    at least one switching valve disposed in the first exhaust path; and
    at least one third exhaust path connecting the switching valve to the second exhaust path.

3. The cleaning apparatus for a vacuum exhaust system according to claim 1, wherein
    the disc-shaped component includes a plurality of disc-shaped components which each have at least one opening, and
    the cold trap is configured such that the plurality of disc-shaped components are layered with the at least one opening positioned in different phases.

4. The cleaning apparatus for a vacuum exhaust system according to claim 1, further comprising:
    a branch path disposed in the second exhaust path;
    an on-off valve disposed in the branch path; and
    a deposit collection container disposed downstream of the on-off valve.

5. The cleaning apparatus for a vacuum exhaust system according to claim 1, further comprising:
    a deposit discharge port disposed in the casing of the cold trap;
    an on-off valve disposed downstream of the deposit discharge port; and
    a deposit collection container disposed downstream of the on-off valve.

* * * * *